United States Patent [19]

Goedicke et al.

[11] Patent Number: 5,750,185
[45] Date of Patent: May 12, 1998

[54] METHOD FOR ELECTRON BEAM DEPOSITION OF MULTICOMPONENT EVAPORANTS

[75] Inventors: Klaus Goedicke; Christoph Metzner; Volker Kirchhoff; Wolfgang Hempel. all of Dresden; Nicolas Schiller. Helmsdorf. all of Germany

[73] Assignee: Fraunhofer-Gesellschaft zur Foerderung der angewandten Forschung e.V.. Munich. Germany

[21] Appl. No.: 638,393

[22] Filed: Apr. 29, 1996

Related U.S. Application Data

[63] Continuation of PCT/DE94/01208, Oct. 11, 1994.
[51] Int. Cl.⁶ ................................................ B05D 3/06
[52] U.S. Cl. ................................. 427/8; 427/10; 427/566
[58] Field of Search .......................... 427/8, 9, 10, 566, 427/567; 204/192.13, 298.03

[56] References Cited

U.S. PATENT DOCUMENTS

| | | | |
|---|---|---|---|
| 3,612,859 | 10/1971 | Schumacher | 219/121.15 |
| 3,854,984 | 12/1974 | Schadler et al. | 427/293 |
| 4,166,784 | 9/1979 | Chapin et al. | 204/192.13 |
| 4,262,160 | 4/1981 | McKoon et al. | 13/31 EB |
| 4,988,844 | 1/1991 | Dietrich et al. | 219/121.17 |
| 5,051,599 | 9/1991 | Benes et al. | 219/121.23 |

FOREIGN PATENT DOCUMENTS

| | | |
|---|---|---|
| 43 04 612 A1 | 8/1994 | Germany. |
| 60-26660 | 2/1985 | Japan. |

OTHER PUBLICATIONS

"Sentinel III: Alloy Deposition Controller" published by Leybold Heraeus GmbH, Hanau Works No Date.

L.V. Berzins "Composition Monitoring of Electron Beam Melting Processes Using Diode Lasers" in Electron Beam Melting and Refining—State of the Art 1991, Proc. of the Conf., Reno 1991 (no month given, but must be after May).

*Primary Examiner*—Marianne Padgett
*Attorney, Agent, or Firm*—Evenson, McKeown, Edwards & Lenahan, P.L.L.C.

[57] ABSTRACT

A method for the electron beam deposition of a multicomponent evaporant to ensure a consistent layer quality with constant composition and thickness in a defined manner. The X-radiation emitted from the evaporant on the point of electron beam impingement is measured in situ, using the obtained signal as reference input to control the parameters of the evaporation process and therefore to control the deposition rate and material composition of the deposited layer. The method is used for the production of corrosion resistant, high-temperature resistant, hard-wearing or optical layers on, for example, strip steel or plastic film.

3 Claims, No Drawings

METHOD FOR ELECTRON BEAM DEPOSITION OF MULTICOMPONENT EVAPORANTS

CROSS-REFERENCE TO RELATED APPLICATIONS

This application is a continuation of PCT Application No. PCT/DE94/01208 filed on Oct. 11, 1994.

BACKGROUND AND SUMMARY OF THE INVENTION

The invention relates to a method for electron beam deposition of multicomponent evaporants, especially through the use of high-rate evaporation. The method is to be used mainly for the production of corrosion resistant, high-temperature resistant and hard wearing layers. For instance, these layers are made up of alloys and serve as protective layers on steel. Moreover, they are used for strip steel coating. Another application is the coating of turbine blades with high-temperature resistant alloys (overlay coating). The method is further suitable for the deposition of optically active thin alloy layers on plastic film (solar control films).

A basic requirement for the production and functional reliability of the layers is to ensure constant layer properties throughout the coating time. This requirement places high demands on the coating technique used because, as a rule, the components of the evaporant are components with different evaporation rates. Fluctuations in the process parameters, e.g. the evaporation temperature, have a direct bearing on the evaporation rates of the individual components and therefore on layer composition and deposition rate. Via the coating time the deposition rate is directly tied to the layer thickness. Such fluctuations may not only be caused by fluctuations of the electron beam power but, for instance, also by changes in the heat transfer on the crucible walls, in the material feed or other influence quantities that are difficult to ascertain.

Known for the determination of layer composition and thickness are a series of ex situ measurement methods; e.g. x-ray fluorescence analysis, electron beam microanalysis and glow-discharge spectroscopy. But ex situ methods are excluded from process control for electron beam deposition because too much time elapses between coating and analysis of the layer. It is imaginable to carry out these measurement methods as in situ measurement methods which, if practically possible at all, requires a high engineering expenditure.

Another known method of measuring the deposition rates in vacuum equipment is to measure the frequency change of a quartz oscillator. Because of the fast random coating of the sensor, however, the use of this technique in high-rate coating equipment causes a lot of problems. In addition, it gives no information about the layer composition. In another known method used to determine the vapor composition—and implied also the layer composition—part of the vapor in an ionization chamber is excited to plasma emission. Determined from the emission spectrum are the intensities of characteristic spectral lines, as described in the pamphlet "Sentinel 200: Universal measuring and control device for deposition rates", published by Leybold Heraeus GmbH, Hanau Works. This method gives only measuring results of restricted reliability because the composition of the vapor near the substrate and on the remote measuring site, often decoupled by shutters and pressure stages, differs in a non-defined manner.

It is further known to use the absorption of laser beams in the vapor to measure the material composition. But this method is very costly and could not be used on a large scale up to now, as described by L. V. Berzins in "Composition Monitoring of Electron Beam Melting Processes Using Diode Lasers" in "Electron Beam Melting and Refining—State of the Art 1991", Proc. of the Conf., Reno 1991. Moreover, it is known to use the optical emission of a plasma produced by the direct interaction between electron beam and vapor to obtain information about the material composition. Because of the low plasma density and the strong time-variant fluctuations of the plasma emission this method is afflicted with fundamental limitations of the measuring accuracy. It has been found, however, that the optical emission of the plasma can be increased by a favorable adjustment of the ratio between vapor pressure and acceleration voltage of the electron beam, as described in German patent document DE 43 04 612 A1. A decided drawback of this method is that an intervention into the process (acceleration voltage) becomes necessary to conduct the measurements concerned.

It is an object of the present invention to develop a method for electron beam deposition of multicomponent evaporants, such as alloys, compounds or mixtures, that permits the production of multicomponent layers of a defined and, in particular, constant composition and thickness.

These and other objects have been achieved according to the present invention by providing a method for the electron beam deposition of a multicomponent evaporant contained in a crucible and heated by an impingement of at least one electron beam to evaporate the evaporant, the method comprising the steps of: measuring in situ an X-radiation signal emitted from at least one point of said electron beam impingement on said evaporant; and using the X-radiation signal to determine a material composition of deposited coatings and/or to determine a deposition rate of the evaporant in conjunction with other known and/or measurable parameters of the evaporation process, and/or using the X-radiation signal as at least one reference input to control the evaporation process. The method may further comprise the step of using the X-radiation signal to control a feed of evaporant into the crucible; the step of using the X-radiation signal to control a power density of the electron beam on a surface of the evaporant with respect to time and location; or the step of using the X-radiation signal to control a power of the electron beam.

The evaporation rates of the individual components of the evaporant depend on the process parameters of the evaporation in a way that is difficult to comprehend. Therefore, the layer composition and the deposition rate to be expected cannot be theoretically determined in practice. In order to attain layer properties within given tolerance limits, it is therefore necessary to keep the determined evaporation parameters constant. Although the composition of evaporant and layer differ in general, it was surprising that one or several measurands can be derived from the X-radiation emitted from the evaporant so that, under incorporation of other known or measurable parameters of the evaporation process, the layer composition and the deposition rate can be determined.

The relation between the X-radiation emitted from the evaporant under given evaporation parameters and layer composition as well as deposition rate must therefore be determined by calibration. Suitable for the ex situ analysis of layer composition and thickness are known analyzing methods. The measuring signals of the X-radiation emitted from the evaporant are obtained in the known manner. Depending on the evaporant used, one or several characteristic X-ray lines and ranges of the bremsstrahlung spectrum are separated from the X-ray spectrum. Suitably, ratios of the intensities pertaining to the characteristic lines are evaluated mutually or with regard to the bremsstrahlung intensity.

According to the features of the invented method it is also possible to derive a reference input for the control of the evaporation process from the obtained measuring signal directly. It has been shown that the tolerance limits of layer thickness and deposition rate are always maintained if the signal obtained from the X-radiation of the evaporant is kept constant within certain limits. For the evaporation of an alloy from a water-cooled copper crucible with feeding device the material feed is a suitable correcting variable for the adjustment of constant layer composition and deposition rate. With constant electron beam parameters, for instance, the material feed can be controlled so that the determined measuring signal is invariable with time. For a control of the material feed by, for example, an elevation measurement of the melting bath, on the other hand, it proves to be suitable to control the electron beam power so that the determined measuring signal remains invariable in time. In that way, acting time constant and control precision can be substantially improved.

Even in the case of an evaporant that comprises more than two components it is often advantageous but not mandatory to use only one characteristic X-ray line of one component for measurement. As a rule, the control of the evaporation process results in a direct and equal control of the evaporation rates of all components. Suitably, that component should be chosen which, because of a high vapor pressure, reacts in the most sensitive manner to fluctuations in the evaporation process.

According to the invention, the X-radiation emitted from a plurality of different points on the evaporant surface of extensive evaporator crucibles, especially those with more than one material feeding device, has to be detected separately. This is best accomplished by time-sequential scanning of the evaporator surface with the aid of an X-ray spectrometer. If more stringent requirements have to be placed on measuring and control times, it is also possible to detect the X-radiation by two or more X-ray spectrometers.

These and other objects, features and advantages of the present invention will become more readily apparent from the following description of preferred embodiments.

DESCRIPTION OF PREFERRED EMBODIMENTS

EXAMPLE 1

In a customary vacuum coating plant, flat substrates are coated with NiCr (80% Ni/20% Cr) layers of about 10 μm thickness. Evaporation takes place from a flat, water-cooled copper crucible of 200 mm diameter. The rod-shaped evaporant is fed into the molten bath from below. An electron beam gun with an acceleration voltage of 30 kV and a beam power of 40 kW is used to heat the evaporant. A wavelength-dispersive X-ray spectrometer detects the X-radiation emitted from the center of the evaporator surface. Detected from the X-ray spectrum in a known manner is only the CrKα-radiation and part of the bremsstrahlung. The quotient of both X-ray intensities correlates with the chromium concentration in the melt. According to the invention, a reference input for the layer composition and the deposition rate can be derived from the measuring signal with due consideration of the other evaporation parameters. After equilibrium has been obtained between evaporant feeding and vaporization, the evaporant feed is controlled at constant electron beam power so that the measuring signal derived from the X-radiation remains constant with respect to time. In that way it is ensured that the evaporation rates of both alloying constituents remain constant so that a constant composition and thickness of the deposited layers is obtained. In long-term operation it is therefore possible to keep the chromium concentration in the layer in a range of 19.5% to 20.5%. The layer thickness is kept constant within ±10%.

EXAMPLE 2

In a customary vacuum coating plant, flat substrates sized 400 mm×400 mm are coated with an NiCrAlY layer (20% Cr/10% Al/0.3% Y) of about 100 μm thickness. Evaporation takes place from a long crucible with dimensions of 400 mm×200 mm. The rod-shaped evaporant is entered into the melt at two points of the crucible from below. An electron beam gun with an acceleration voltage of 40 kV and a maximum beam power of 300 kW is used to heat the evaporant. In the known manner the electron beam is deflected by magnetic lens systems so as to obtain a uniform power distribution over the total surface of the evaporator. Two X-ray spectrometers are employed to detect the X-radiation emitted from two points of the evaporator. Detection and evaluation of the X-radiation takes place in each X-ray spectrometer analogous to Example 1; i.e. from the characteristic X-ray lines it is again the CrKα-radiation alone that will be evaluated.

The measurement of the X-radiation emitted from two different points of the evaporator enables the detection of the concentration gradients in the evaporator. Control of layer composition and deposition rate takes place so that differences in the signals obtained from the two X-ray spectrometers are compensated by a suitable control of the beam power distribution. Therefore, gradients of the evaporation rates are avoided that would otherwise be reflected in the horizontal gradients of layer composition and thickness. As soon as an equilibrium of both X-ray signals has been attained, the adjusted value is kept constant by a direct control of both material feeds within an experimentally determined range of variation. Through the use of this control concept, the layer thickness on the substrate is kept constant at ±8% also with respect to time. The concentration of the crucial elements Cr and Al remains in a range of 19–21% and 9–11% respectively.

Although the invention has been described in detail, it is to be clearly understood that the same is by way of example, and is not to be taken by way of limitation. The spirit and scope of the present invention are to be limited only by the terms of the appended claims.

What is claimed is:

1. A method for controlling electron beam deposition of a multicomponent material, said method comprising steps of:

feeding a multicomponent material to be vaporized into a molten bath at a material feed rate;

impinging at least one electron beam on a surface of said molten bath to vaporize said multicomponent material in an electron beam deflection pattern, said electron beam having an electron beam power;

depositing said vaporized multicomponent material on a substrate;

measuring in situ an X-radiation signal omitted from at least one point of said electron beam impingement on said surface; and controlling at least one of said material feed rate, said electron beam deflection pattern, and said electron beam power, such that said measured X-radiation signal remains constant with respect to time to achieve a constant composition of components of said multicomponent material deposited on said substrate.

2. A method according to claim 1, wherein in said controlling step said measured X-radiation signal is controlled to a level corresponding to at least one of a desired deposition rate of the material to be vaporized and a desired material composition of the multicomponent material deposited on said substrate.

3. A method according to claim 2, wherein said level is determined experimentally by ex situ analysis.

* * * * *